United States Patent [19]

Egawa

[11] Patent Number: 5,770,874

[45] Date of Patent: Jun. 23, 1998

[54] HIGH DENSITY SEMICONDUCTOR MEMORY DEVICE

[75] Inventor: Yuichi Egawa, Tokyo, Japan

[73] Assignee: Nippon Steel Corporation, Tokyo, Japan

[21] Appl. No.: 966,751

[22] Filed: Nov. 10, 1997

Related U.S. Application Data

[63] Continuation of Ser. No. 558,081, Nov. 13, 1995, abandoned.

[30] Foreign Application Priority Data

Nov. 14, 1994 [JP] Japan .................................. 6-304288

[51] Int. Cl.$^6$ ................................................ H01L 27/108

[52] U.S. Cl. ........................................ 257/296; 257/905

[58] Field of Search .................................. 257/296, 905, 257/908

[56] References Cited

U.S. PATENT DOCUMENTS

| | | | |
|---|---|---|---|
| 4,651,183 | 3/1987 | Lange et al. | 257/296 |
| 5,250,831 | 10/1993 | Ishii | 257/354 |
| 5,332,923 | 7/1994 | Taleuchi | 257/758 |

Primary Examiner—Jerome Jackson
Assistant Examiner—John Guay
Attorney, Agent, or Firm—Pollock, Vande Sande & Priddy

[57] ABSTRACT

A high density semiconductor memory device includes: a semiconductor substrate; and a plurality of memory cell groups formed on the semiconductor substrate, each of the memory cell groups including a plurality of memory cells having one common source/drain region, wherein when a surface of the semiconductor substrate is divided into a plurality of areas which are arranged in a matrix of rows extending in a first direction and columns extending in a second direction intersecting the first direction, the memory cell groups are selectively arranged in the areas such that the memory cell groups are located in every other one of the areas arranged in each of the rows and also in every other one of the areas arranged in each of the columns.

17 Claims, 5 Drawing Sheets

HIGH DENSITY SEMICONDUCTOR MEMORY DEVICE

This application is a Continuation of U.S. patent application Ser. No. 08/558,081, filed Nov. 13, 1995, now abandoned.

BACKGROUND OF THE INVENTION

1. Field of the Invention

The present invention relates in general to a high density semiconductor memory device, and more particularly to a high density semiconductor memory device characterized by an arrangement of memory cells constituting the semiconductor memory device on a semiconductor substrate.

2. Description of the Related Art

Figure 6:
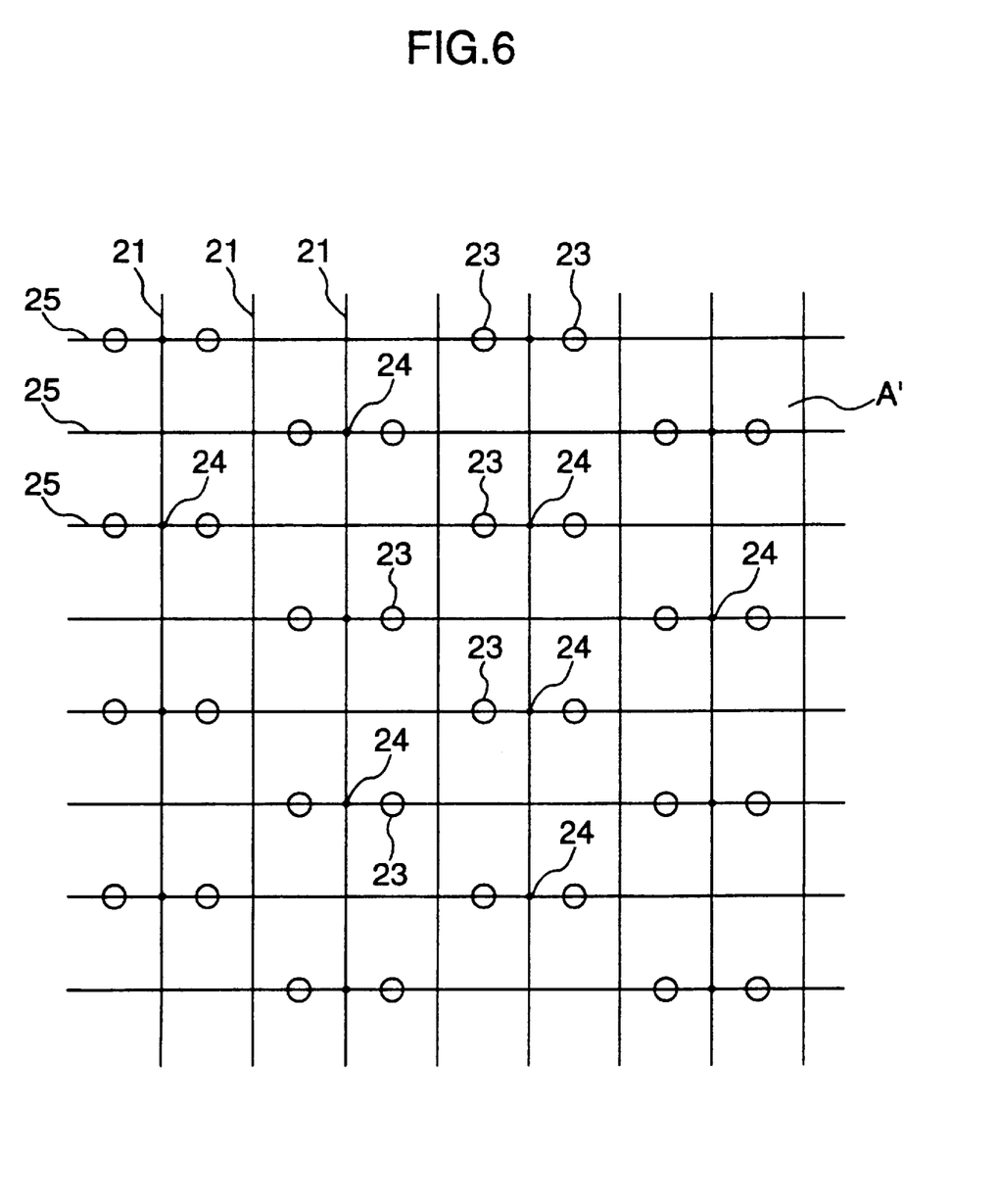
FIG. 6 is a schematic view showing a skeleton of a memory cell arrangement of a conventional DRAM.

Heretofore, in a DRAM (Dynamic Random Access Memory) having a transistor, of which one source/drain electrode is connected to a bit line through a bit contact and a gate electrode is connected to a word line, a large number of word lines 21 extend substantially in parallel to one another, as shown in FIG. 6 for example, a large number of bit lines 25 extend in a direction intersecting with the word lines, and memory cells 23 are respectively provided at the intersections of the word lines 21 with the bit lines 25. In addition, one bit contact 24 is provided for each pair of memory cells which are associated with the corresponding bit line 25. In the high density of memory cells in the memory circuit, a space between the adjacent bit lines 25 becomes narrower, in general, the memory cell pairs are arranged in zig-zag so that the bit contacts 24 of the adjacent bit lines 25 do not overlap each other. Therefore, in an area which is defined by eight word lines and eight bit lines as shown in FIG. 6, 32 memory cells 23 and 16 bit contacts 24 are provided.

However, since when the bit lines are in close proximity to each other as described above, the bit line capacitance is increased, the storage capacity of each memory cell needs to be made larger in order to ensure the read voltage margin during the read operation. As a result, the cell area is increased and the size of the whole device is increased. This is a problem inherent in the prior art. In addition, it is to be understood that if the adjacent bit lines are separated further from each other in the above-mentioned arrangement, the bit line capacitance will be decreased, but the number of bit lines or the number of memory cells per unit area is decreased, and hence a large area is required for ensuring the same storage capacity.

In order to integrate the memory cells in high density, it is proposed, as disclosed in U.S. Pat. No. 4,651,183 issued to R. C. Lange et al. on Mar. 17, 1987 entitled "High Density One Device Memory Cell Arrays" (Japanese Patent Kokai No. 61-14747) for example, to constitute the memory device by a plurality of memory cell groups each of which includes four memory cells having a common source/drain region, wherein the plurality of memory cell groups are arranged on a substrate in such a way that the capacitors of the memory cells included in the respective groups are arranged in a matrix of rows and columns as a whole, and the common source/drain region is connected to a plurality of bit lines which intersect obliquely with the rows and the columns. However, in the above-mentioned arrangement, it is considered that it will be very difficult to form the word lines to which the gate electrodes of the memory cells are respectively connected, and also there is no detailed description about the formation of the word lines in the above U.S. Patent.

SUMMARY OF THE INVENTION

It is therefore an object of the present invention to provide a high density semiconductor memory device having a structure in which a space between the adjacent bit lines can be sufficiently increased to an extent that the read voltage during the read operation is not affected and the word lines can be readily formed without decreasing the number of memory cells per unit area.

According to the present invention, a high density semiconductor memory device includes a semiconductor substrate and a plurality of memory cell groups formed on the semiconductor substrate, each of the memory cell groups including a plurality of memory cells having a common diffusion region. When a surface of the semiconductor substrate is divided into a plurality of areas arranged in a matrix of rows extending in a first direction and columns extending in a second direction intersecting the first direction, the plurality of memory cell groups are selectively arranged such that the memory cell groups are disposed in every other one of the areas arranged in each of the rows and also in every other one of the areas arranged in each of the columns.

A high density semiconductor memory device according to one aspect of the present invention includes: a semiconductor substrate; and a plurality of memory cell groups formed on the substrate, each of the memory cell groups including four memory cells, each of which includes a transistor having a pair of source/drain diffusion regions and one gate electrode and a capacitor connected to one of the source/drain diffusion regions, while the other of the source/drain diffusion regions is common to the four memory cells. When a surface of the semiconductor substrate is divided into a plurality of areas which are arranged in a matrix of rows extending in a first direction and and columns extending in a second direction intersecting the first direction, the plurality of memory cell groups are selectively disposed in the areas such that the plurality of memory cell groups are located in every other one of the areas arranged in each of the rows and also in every other one of the areas arranged in each of the columns.

A high density semiconductor memory device according to another aspect of the present invention includes: a semiconductor substrate; a plurality of memory cell groups formed on the semiconductor substrate, each of the memory cells including four memory cells having a common source/drain diffusion region, each of the memory cells including a capacitor and a transistor having a gate electrode and connecting the capacitor to the common source/drain diffusion region; and a word line arrangement formed on the semiconductor substrate and including a first group of word line pairs extending in a first direction, each of the word line pairs including two spaced word lines, and a second group of word line pairs extending in a second direction intersecting the first direction, each of the second group of word line pairs including two spaced word lines. A plurality of intersection areas are provided in a matrix of rows extending in the first direction and columns extending in the second direction at intersections between the first group of word line pairs and the second group of word line pairs. The common source/drain diffusion regions of the memory cell groups are formed selectively in the intersection areas such that the common source/drain diffusion regions are located in every other one of the intersection areas disposed in each of the rows and also in every other one of the intersection areas disposed in each of the columns, and the four memory cells connected to each common source/drain diffusion region are connected to the word line pair of the first group and the word line pair of the second group which intersect with each other at the intersection area where the common source/drain diffusion region is formed.

In the semiconductor memory device according to the present invention, since the plurality of memory cell groups each of which includes the four memory cells having the common source/drain diffusion region are arranged as described above, the number of bit lines which are connected to the common source/drain diffusion regions of the plurality of memory cell groups is reduced to half as compared with that of the conventional semiconductor memory device. Therefore, since the number of bit contacts is also reduced to half and the distance between the adjacent bit lines can be increased, it is possible to ensure the necessary storage capacity of memory cell without reducing the number of memory cells per unit area.

DESCRIPTION OF THE PREFERRED EMBODIMENTS

A DRAM according to an embodiment of the present invention will hereinafter be described in detail with reference to the accompanying drawings.

Figure 2:
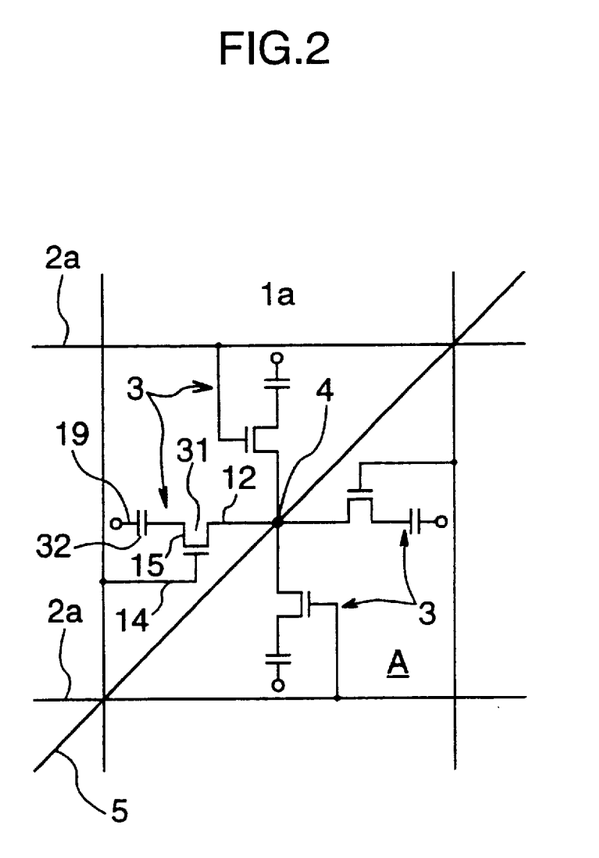
FIG. 2 is a circuit diagram showing the electrical connection of a group of memory cells in the embodiment of the present invention.

A DRAM of the present invention includes a plurality of memory cell groups which are formed on a semiconductor substrate 11 and each of the memory cell groups includes four memory cells 3. Each of the four memory cells 3 included in each cell group includes, as shown in FIG. 2, a transistor 31 which has a pair of source/drain diffusion regions 12 and 15 and a gate electrode 14, and a capacitor 32 which is connected to the transistor 31, wherein one of the source/drain diffusion regions 12 is common to the four memory cells and connected through a bit contact 4 to a bit line 5 as will be described later.

When the surface of the semiconductor substrate 11 is divided into a plurality of rectangular areas B which are arranged in a matrix of a plurality of rows (only four rows 41 to 44 are shown), which are divided by a plurality of parallel row lines extending in a first direction (a vertical direction in the figure), and a plurality of columns (only four columns 51 to 54 are shown) which are divided by a plurality of parallel column lines extending in a second direction (a horizontal direction in the figure), intersecting, preferably perpendicularly, with the first direction, the plurality of memory cell groups are selectively arranged in the areas B such that the memory cell groups are located in every other one of the areas B arranged in each of the rows and also in every other one of the areas B arranged in each of the columns. By arranging the memory cell groups in such a way, a plurality of the rectangular areas B, where the memory cell groups are disposed, are aligned in a third direction at an angle of 45° with each of the first and second directions, respectively, and each of bit lines 5 is formed so as to connect the common source/drain diffusion regions of the memory cell groups aligned in the third direction.

Referring back to FIG. 1, a plurality of word lines $1a$ of a first group 1 which extend parallelly in the first direction with a predetermined distance between them and a plurality of word lines $2a$ of a second group 2 which extend parallelly in the second direction with a predetermined distance are provided on the semiconductor substrate. In addition, a plurality of bit lines 5 which extend parallelly in the third direction substantially at an angle of 45° with each of the first and second directions are also provided on the semiconductor substrate. A word line pair $1b$ is formed of adjacent two of the word lines $1a$ of the first group, and one word line pair $1b$ is provided to extend through the areas B disposed in each of the rows. In addition, a word line pair $2b$ is formed of adjacent two of the word lines $2a$ of the second group, and one word line pair $2b$ is provided to extend through the areas B disposed in each of the columns. A rectangular area A as shown in FIG. 2 is formed at an intersection between each of the word line pairs $1b$ of the first group and each of the word line pairs $2b$ of the second group, and hence a plurality of the areas A are arranged in a matrix of rows and columns on the semiconductor substrate.

Gate electrodes of two of the four memory cells of each memory cell group, which are provided in one area A, are respectively connected to two word lines $1a$ of one word line pair $1b$ of the first group which pass through that area A. Gate electrodes of other two memory cells are respectively connected to two word lines $2a$ of one word line pair $2b$ of the second group which pass through that area A.

In addition, four word lines $2a$ of the second group are present between adjacent two memory cell groups connected to each word line pair $1b$ of the first group. Likewise, four word lines $1a$ of the first group are present between adjacent two memory cell groups connected to each word line pair $2b$ of the second group. Therefore, with respect to the small rectangular areas A which are arranged in a matrix, three empty rectangular areas A (for example, rectangular areas $A_3$, $A_4$ and $A_5$) are present between adjacent two memory cell groups (for example, cell groups disposed in the area $A_1$ and $A_2$) arranged either in the first direction or in the second direction, and one empty rectangular area A (for example, rectangular area $A_7$) is present between adjacent two memory cell groups (for example, cell groups disposed in the area $A_2$ and $A_6$) in the third direction.

Figure 1:
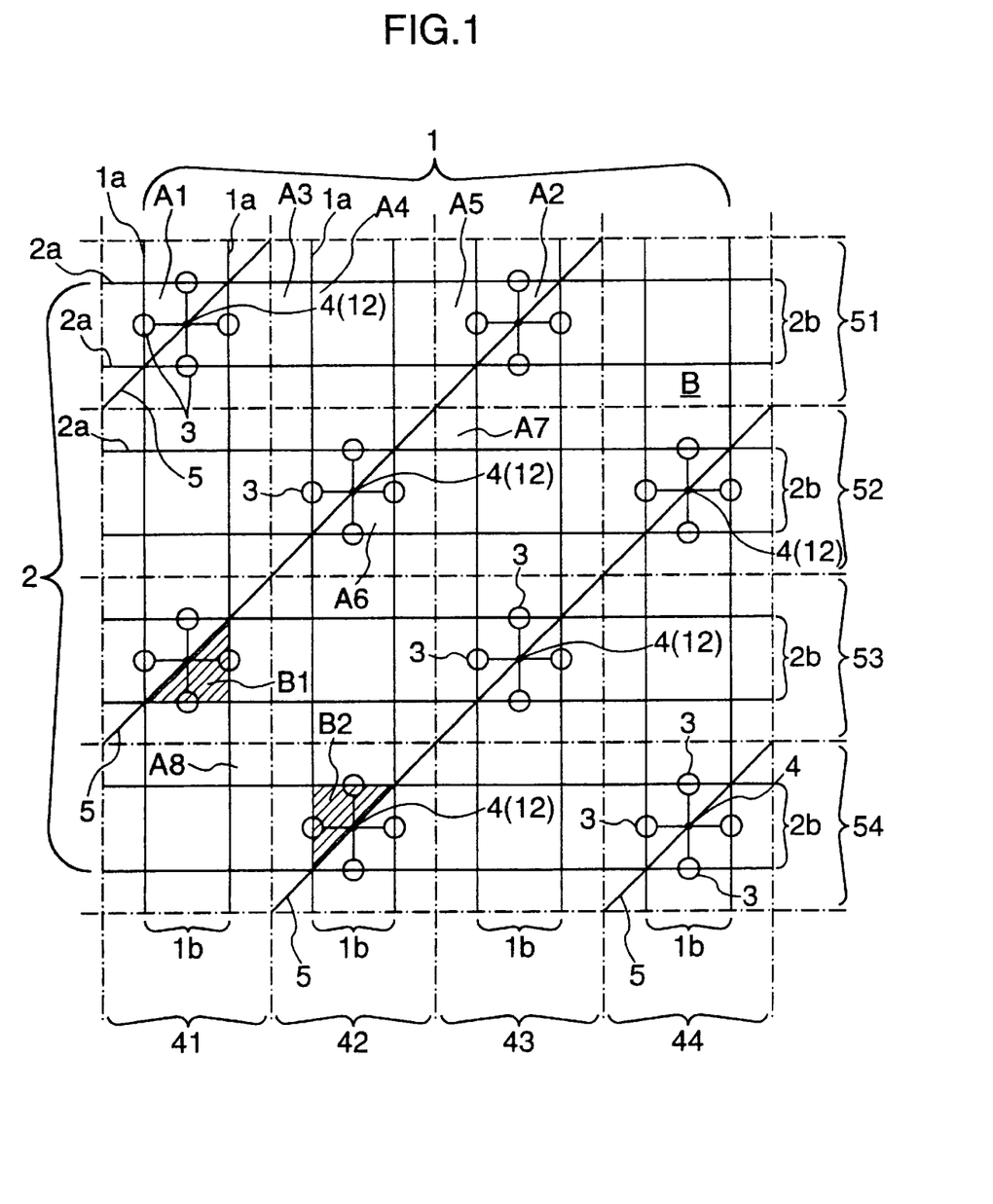
FIG. 1 is a schematic view showing a skeleton of a memory cell arrangement of a DRAM according to an embodiment of the present invention.

As compared with the conventional DRAM shown in FIG. 6, the rectangular areas A in the matrix arrangement in FIG. 1 which are defined by the word lines $1a$ and $2a$ correspond to the rectangular areas A' in the matrix arrangement in FIG. 6 which are defined by the word lines 25 and the bit lines 21. Thus, the number of memory cells per unit area on the semiconductor substrate in FIG. 1 is the same as that in FIG. 6, but the distance between adjacent two bit lines can be made larger in the arrangement of FIG. 1 than that in the arrangement of FIG. 6.

Figure 3:
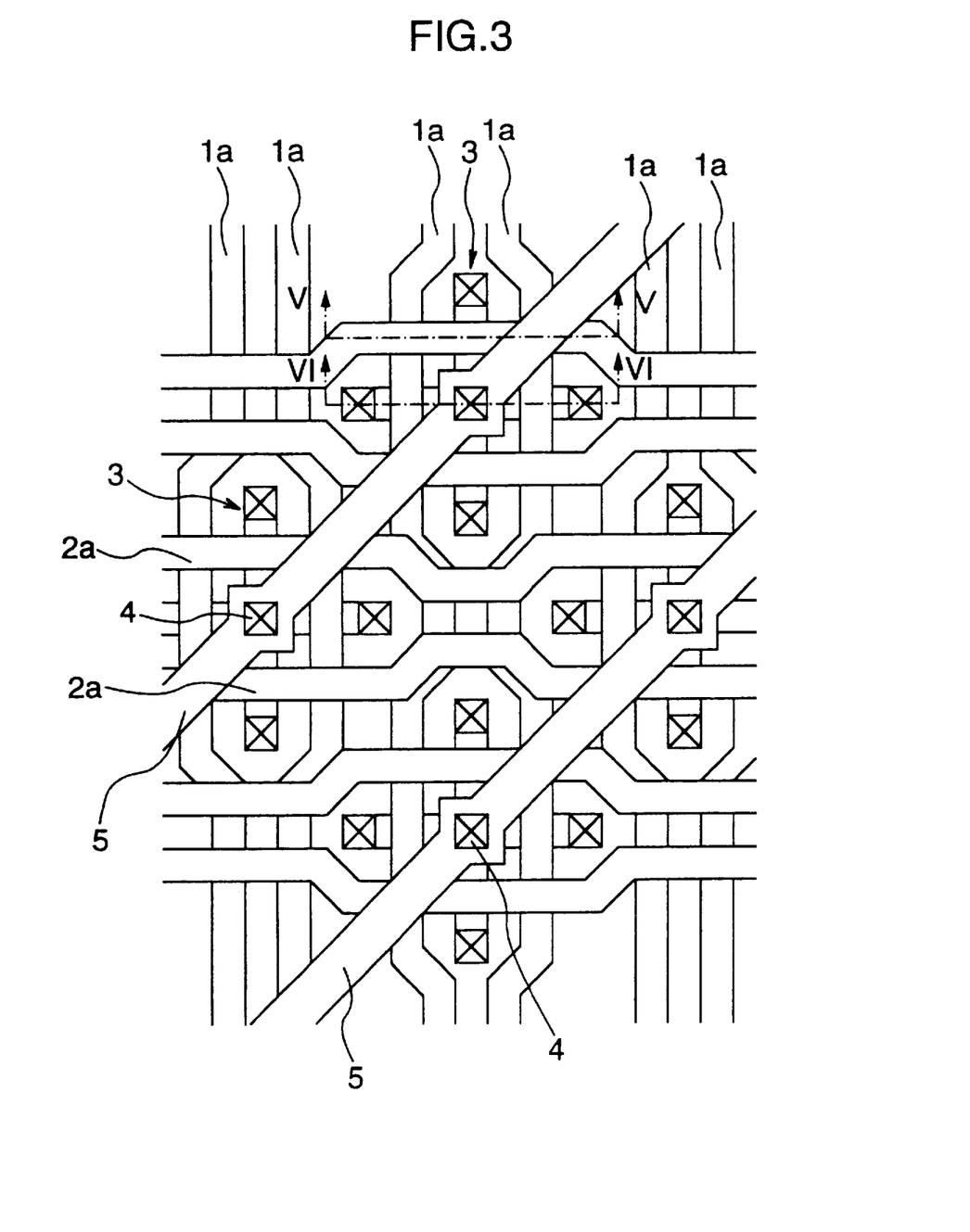
FIG. 3 is a plan view showing an arrangement of a semiconductor memory device according to the embodiment of the present invention.

FIG. 3 is a plan view showing an arrangement of a DRAM employing the arrangement of FIG. 1. As can be seen from FIG. 3, at the intersection between the word line $1a$ of the first group and the word line $2a$ of the second group, they are formed at different levels on the surface of the semiconductor substrate, and the bit line 5 is formed at a layer above the word lines 1a and 2a. In addition, in order to prevent each bit line 5 from being connected to a plurality of memory cell groups connected to the same word line, each bit line is formed so as to extend in a third direction at an angle of 45° with the direction of the word line (the first or second direction). As a result, adjacent two bit lines are separated from each other by a distance corresponding to almost two small rectangular areas A (for example, two halves (hatched area) $B_1$, $B_2$ and one $A_3$ of the rectangular areas)

Figure 4:
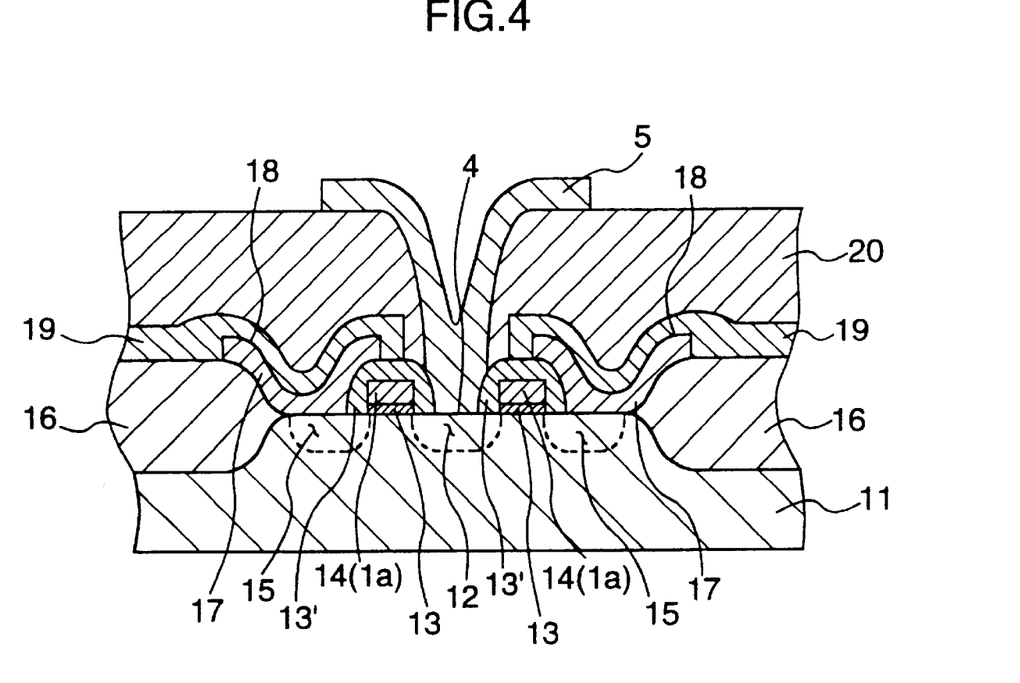
FIG. 4 is a cross sectional view taken along the line IV—IV of FIG. 3.
Figure 5:
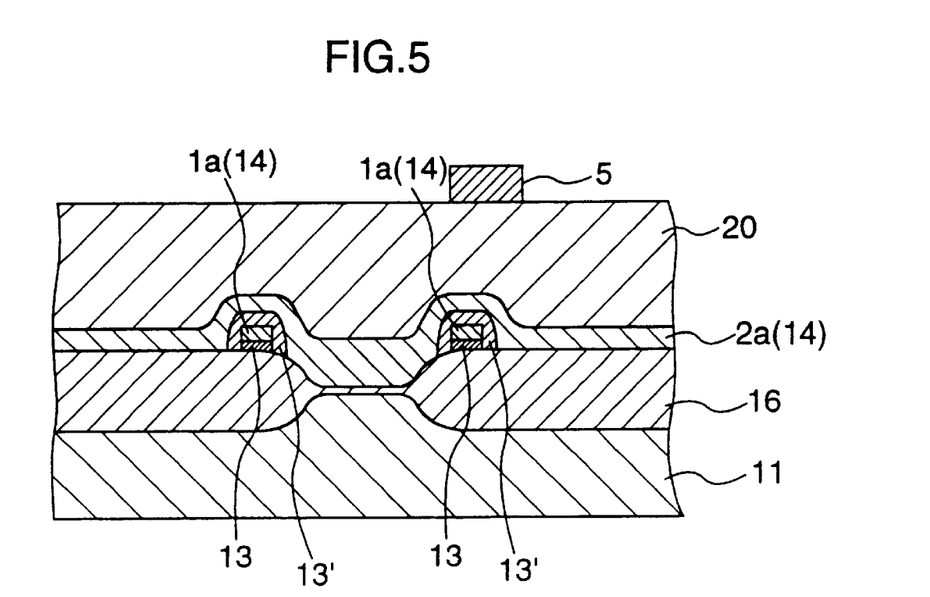
FIG. 5 is a cross sectional view taken along the line V—V of FIG. 3.

FIG. 4 is a cross sectional view taken along the line IV—IV of FIG. 3 and FIG. 5 is a cross sectional view taken along the line V—V of FIG. 3. In FIGS. 4 and 5, two gate structures, each including a gate insulating film 13 and a gate electrode 14, are formed on the semiconductor substrate 11 symmetrically at right and left sides with respect to the common source/drain diffusion region 12. Further, in each gate structure, an interlayer insulating film 13' is formed to cover the gate electrode 14. The other source/drain diffusion regions 15 and isolation films 16 are respectively formed outside the right and left hand sides of the common source/drain diffusion region 12. A lower electrode 17 of the capacitor, a capacitor insulating film 18 and an upper electrode 19 of the capacitor are laminated in this order on each of the other source/drain diffusion regions 15. Further, the bit line 5 is formed above the upper electrodes 19 through an interlayer insulating film 20, and connected to the common source/drain diffusion region 12 through a bit contact 4.

Further, as shown in FIG. 5, word lines 1a (14) are formed on the semiconductor substrate 11 and a word line 2a (14) is formed to extend above the word lines 1a, each being covered by an interlayer insulating film 13'. Thus, the word line 2a is electrically insulated from the word line 1a by the interlayer insulating film 13' and also extends to cross the word line 1a.

As seen from the above-mentioned description, according to the semiconductor memory device of the present invention, the word lines are formed of the first group of word lines extending in the first direction with a predetermined distance therebetween, and the second group of word lines extending in the second direction intersecting with the first direction with a predetermined distance therebetween, and each bit contact is provided in an area surrounded by two word lines belonging to the first group and two word lines belonging to the second group, and the memory cells connected to the bit contact are provided in the area defined by the four word lines, and each of the bit lines extends in a direction intersecting with the first and second word lines, whereby the number of bit contacts can be reduced to half, and the number of word lines per unit area can be made twice so that the number of bit lines per unit area can be reduced to half, and hence the bit lines can be much spaced from each other. Accordingly, since the bit line capacitance is reduced and the capacitance (area) of the memory cell can be reduced, the higher density in integration of the memory cells can be attained.

The present invention has been explained exemplarily with respect to an embodiment in which each memory cell group includes four memory cells connected to one of the bit lines through a common bit contact. However, it will be appreciated that the invention can be applied to a case where a plurality of memory cells, such as five, six or more memory cells are connected to a common bit line by adjusting the space between adjacent two of the memory cell groups arranged in each row and also in each column.

I claim:

1. A high density semiconductor memory device comprising:

a semiconductor substrate;

a plurality of memory cell groups formed on said semiconductor substrate, each of said memory cell groups including four memory cells having a common source/drain region, each of said memory cells including a capacitor and a transistor having a gate electrode and connecting said capacitor to said common source/drain region;

a word line arrangement provided on said semiconductor substrate, said word line arrangement including a first group of word line pairs extending in a first direction, each of said word line pairs having two spaced word lines, and a second group of word line pairs extending in a second direction intersecting the first direction, each of said word line pairs having two spaced word lines, wherein a plurality of intersection areas arranged in a matrix of rows extending in said first direction and columns extending in said second direction are defined at intersections between said first group of word line pairs and said second group of word line pairs, wherein said common source/drain regions of said plurality of memory cell groups are disposed in selected ones of said intersection areas such that said common source/drain regions are located in every other one of said intersection areas arranged in each row and also in every other one of said intersection areas arranged in each column, while none of said common/source drain regions is arranged in said intersection areas other than said selected ones, and said gate electrodes of said memory cell groups are connected to said word line pair of said first group and said word line pair of said second group which intersect at said selected intersection area where said memory cell group is disposed; and a plurality of bit lines formed on said semiconductor substrate extending in a third direction which is a diagonal direction of the matrix of rows and columns, each said bit line contacting one said common source/drain region in each consecutive row and each consecutive column of the matrix.

2. A high density semiconductor memory device according to claim 1, wherein the first direction intersects substantially perpendicularly to the second direction, and the third direction intersects at an angle of 45° with each of the first and second directions.

3. A high density semiconductor memory device according to claim 2, wherein the first group of word line pairs and the second group of word line pairs are formed as layers of different levels at each of the intersection areas.

4. A high density semiconductor memory device according to claim 1, wherein one word line pair of at least one of said first and second group is disposed between two adjacent memory cell groups connected to one word line pair of the other of said first and said second group.

5. A high density semiconductor memory device comprising:

a semiconductor substrate; and a plurality of memory cell groups formed on said semiconductor substrate, each of said memory cell groups including four memory cells having a common source/drain region;

wherein when a surface of said semiconductor substrate is divided into a plurality of areas which are arranged in a matrix of rows extending in a first direction and columns extending in a second direction intersecting with the first direction, said plurality of memory cell groups are disposed in selected ones of said areas such that said plurality of memory cell groups are located in every other one of said areas arranged in each row and also in every other one of said areas arranged in each column, while none of said memory cell groups is disposed in said areas other than said selected ones; and a plurality of bit lines formed on said semiconductor substrate extending in a third direction which is a diagonal direction of the matrix of rows and columns, each said bit line contacting one said common source/drain region in each consecutive row and each consecutive column of the matrix.

6. A high density semiconductor memory device according to claim 5, wherein each of said plurality of memory cells includes a capacitor.

7. A high density semiconductor memory device according to claim 5, wherein each of said plurality of memory cells includes a capacitor and a transistor connecting said capacitor to said common source/drain region.

8. A high density semiconductor memory device according to claim 5, wherein each of said memory cell groups includes four memory cells.

9. A high density semiconductor memory device according to claim 8, wherein each of the four memory cells includes a capacitor.

10. A high density semiconductor memory device according to claim 8, wherein each of the four memory cells includes a capacitor and a transistor, said transistor having a gate electrode and connecting said capacitor to said common source/drain diffusion region.

11. A high density semiconductor memory device according to claim 10, further comprising a plurality of word lines formed on said semiconductor substrate and extending in the first direction such that two of said word lines pass through one of the rows of said memory cell groups, and a plurality of word lines formed on said semiconductor substrate and extending in the second direction such that two of said word lines pass through one of the columns of said memory cell groups, wherein the gate electrodes of two memory cells of the memory cell group arranged in one of the selected areas are respectively connected to the two word lines extending in the first direction and passing through said selected area, and also the gate electrodes of the other two memory cells of the memory cell group are respectively connected to the two word lines extending in the second direction and passing through said selected area.

12. A high density semiconductor memory device according to claim 5, wherein the first direction intersects substantially perpendicularly to the second direction, and the third direction intersects at an angle of 45° with each of the first and second directions.

13. A high density semiconductor memory device according to claim 11, wherein two of the word lines extending in the second direction are formed between adjacent two of the memory cell groups arranged in each of the rows, and two of the word lines extending in the first direction are formed between the adjacent two of the memory cell groups arranged in each of the columns.

14. A high density semiconductor memory device comprising:

a semiconductor substrate;

a plurality of diffusion regions formed in said semiconductor substrate and arranged in a matrix of rows extending in a first direction and columns extending in a second direction intersecting the first direction, wherein said diffusion regions are arranged at selected ones of intersection areas at which the rows intersect the columns such that the diffusion regions are disposed in every other one of the intersection areas arranged in each of the rows and also in every other one of the intersection areas arranged in each of the columns, while none of said diffusion areas is arranged in said intersection areas other than said selected ones of said intersection areas;

a plurality of memory cell groups formed so as to surround said plurality of diffusion regions, respectively, each of said memory cell groups including four memory cells, each of which includes a capacitor and a transistor, said transistor having a gate electrode and connecting said capacitor to the associated diffusion region;

a word line arrangement including a first group of word line pairs formed along said rows, each of said word line pairs of said first group including two spaced word lines extending in the first direction, and a second group of word line pairs formed along the columns, each of said word line pairs of said second group including two spaced word lines extending in the second direction, wherein each word line pair of the first group is connected to two of the four memory cells of each of the memory cell groups arranged in the row along which the word line pair extends, and each word line pair of the second group is connected to the other two of the four memory cells of each of the memory cell groups arranged in the column along which said word line pair extends; and a plurality of bit lines formed on said semiconductor substrate extending in a third direction which is a diagonal direction of said matrix of rows and columns, each said bit line contacting one said common source/drain region in each consecutive row and each consecutive column of the matrix.

15. A high density semiconductor memory device according to claim 14, wherein the first direction intersects substantially perpendicularly to the second direction, and the third direction intersects at an angle of 45° with each of the first and second directions.

16. A high density semiconductor memory device comprising:

a semiconductor substrate;

a plurality of memory cell groups formed on said semiconductor substrate, each of said memory cell groups including four memory cells having a common source/drain region, each of said memory cells including a capacitor and a transistor having a gate electrode and being connected between said capacitor and said common source/drain region; and a word line arrangement formed on said semiconductor substrate, said word line arrangement including a first group of first word line pairs $X_1, X_2, X_3 \ldots X_m, \ldots$, generally designated by $X_m$, where m is a positive integer, each first word line pair having a pair of spaced first word lines extending in a first direction, and a second group of second word line pairs $Y_1, Y_2, Y_3, \ldots Y_n \ldots$, generally designated by $Y_n$, where n is a positive integer, each second word line pair having a pair of spaced second word lines extending in a second direction intersecting said first direction, wherein a plurality of intersection areas generally designed by $X_m Y_n$ arranged in a matrix of rows extending in said first direction and columns extending in said second direction are defined at intersections of said first word line pairs $X_m$ and said second word line pairs $Y_n$;

wherein said common source/drain regions of said plurality of memory cell groups are disposed in selected intersection areas, represented by $P_m\ Q_n$, wherein $m=2i-1$, $n=2j-1$ or $m=2i$, $n=2j$, each of i and j is a positive integer, of said plurality of intersection areas such that the common source/drain regions are located in every other one of the intersections arranged in each row and also in every other one of the intersection areas arranged in each column, while none of said common source/drain regions is disposed in non-selected intersection areas, and the gate electrodes of said memory cells of each cell group are connected to the first word line pair and the second word line pair which intersect at the intersection area where said cell group is disposed; and a plurality of bit lines formed on said semiconductor substrate extending in a third direction which is a diagonal direction of the matrix of rows and columns each said bit line contacting one said common source/drain region in each consecutive row and each consecutive column of the matrix.

17. A high density semiconductor memory device according to claim 16, wherein the common source/drain regions of the memory cell groups disposed in the intersection areas represented by ... $X_{m-2}Y_{n+2}$, $X_{m-1}Y_{n-1}$, $X_m Y_n$, $X_{m+1}Y_{n+1}$, $X_{m+2}Y_{n-2}$, ... generally by $X_{m-j}Y_{n+j}$ are connected to a common bit line.

\* \* \* \* \*